United States Patent
Ando (10) Patent No.: US 8,076,771 B2
(45) Date of Patent: Dec. 13, 2011

(54) SEMICONDUCTOR DEVICE HAVING METAL CAP DIVIDED BY SLIT

(75) Inventor: Hideko Ando, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 246 days.

(21) Appl. No.: 12/146,864

(22) Filed: Jun. 26, 2008

(65) Prior Publication Data
US 2009/0001555 A1    Jan. 1, 2009

(30) Foreign Application Priority Data
Jun. 26, 2007 (JP) ................... 2007-167063

(51) Int. Cl.
H01L 23/06 (2006.01)
H01L 23/10 (2006.01)
H01L 23/34 (2006.01)
H01L 23/12 (2006.01)

(52) U.S. Cl. ........ 257/704; 257/684; 257/706; 257/707; 257/710; 257/924; 257/E23.181; 257/E23.193; 257/E23.101

(58) Field of Classification Search .................. 257/678, 257/704, 710, 924, 706, 707, 708, 684, E23.181, 257/E23.193, E23.101
See application file for complete search history.

(56) References Cited

U.S. PATENT DOCUMENTS

| | | | |
|---|---|---|---|
| 4,415,025 A | | 11/1983 | Horvath |
| 4,833,567 A * | | 5/1989 | Saaski et al. ................. 361/700 |
| 5,473,191 A * | | 12/1995 | Tanaka .......................... 257/680 |
| 5,825,087 A * | | 10/1998 | Iruvanti et al. ................. 257/707 |
| 5,909,057 A * | | 6/1999 | McCormick et al. .......... 257/704 |
| 6,216,608 B1 * | | 4/2001 | Woods et al. ............... 108/57.25 |
| 6,239,486 B1 * | | 5/2001 | Shimizu et al. ............... 257/704 |
| 6,281,573 B1 * | | 8/2001 | Atwood et al. ............... 257/706 |
| 6,294,831 B1 * | | 9/2001 | Shishido et al. .............. 257/729 |
| 6,376,907 B1 | | 4/2002 | Takano et al. |
| 6,437,437 B1 * | | 8/2002 | Zuo et al. ...................... 257/710 |
| 6,489,668 B1 * | | 12/2002 | Oda et al. ...................... 257/675 |
| 6,607,942 B1 * | | 8/2003 | Tsao et al. .................... 438/122 |
| 6,826,053 B2 * | | 11/2004 | Kato et al. .................... 361/715 |

(Continued)

FOREIGN PATENT DOCUMENTS

JP    58-33860    2/1983

(Continued)

OTHER PUBLICATIONS

Official Action dated Aug. 23, 2011 issued in corresponding Japanese Application No. 2007-167063 and English Translation.

*Primary Examiner* — Minhloan T Tran
*Assistant Examiner* — Teresa M Arroyo
(74) *Attorney, Agent, or Firm* — Young & Thompson (57) ABSTRACT

In order to reduce a thermal stress applied by a metal cap to a semiconductor chip: a semiconductor chip (2) is bonded to a flat portion (11) of a metal cap (1); side wall portions of the metal cap (1) serve as external connection terminals (13); and a slit (7) is formed in the metal cap (1) so as to cross the semiconductor chip (2), so a bonding region between the semiconductor chip (2) and the metal cap (1) is divided into small bonding regions to reduce thermal stresses applied to the respective bonding regions. Therefore, peeling can be prevented in respective bonding regions, whereby a small-size semiconductor device in which the semiconductor chip is bonded to the metal cap with improved bonding reliability is obtained.

6 Claims, 11 Drawing Sheets

U.S. PATENT DOCUMENTS

| | | | |
|---|---|---|---|
| 6,898,084 B2 * | 5/2005 | Misra | 361/710 |
| 6,909,177 B2 * | 6/2005 | Kang | 257/711 |
| 6,972,485 B2 * | 12/2005 | Kong et al. | 257/704 |
| 7,030,505 B2 | 4/2006 | Kimura | 257/796 |
| 7,057,276 B2 * | 6/2006 | Lin et al. | 257/707 |
| 7,161,238 B2 * | 1/2007 | Hsieh et al. | 257/704 |
| 7,215,020 B2 * | 5/2007 | Nakase et al. | 257/706 |
| 7,224,057 B2 * | 5/2007 | Yang | 257/707 |
| 2002/0109219 A1 * | 8/2002 | Yang et al. | 257/712 |
| 2003/0118277 A1 * | 6/2003 | Yu et al. | 385/18 |
| 2004/0021216 A1 | 2/2004 | Hosoya | |
| 2005/0263879 A1 * | 12/2005 | Michel et al. | 257/706 |
| 2005/0269689 A1 * | 12/2005 | Tetsuka | 257/706 |
| 2006/0017155 A1 * | 1/2006 | Wang | 257/703 |
| 2006/0027914 A1 * | 2/2006 | Bish et al. | 257/704 |
| 2006/0289985 A1 * | 12/2006 | Bettinelli | 257/704 |
| 2007/0045819 A1 * | 3/2007 | Edwards et al. | 257/704 |

FOREIGN PATENT DOCUMENTS

| | | |
|---|---|---|
| JP | 63-40352 | 2/1988 |
| JP | 6-85151 | 3/1994 |
| JP | 9-199517 | 7/1997 |
| JP | 11-163186 | 6/1999 |
| JP | 2004-040008 | 2/2004 |

* cited by examiner

| | RATIO BETWEEN SLIT WIDTH AND CHIP SIDE LENGTH | ELECTRICAL RESISTANCE | THERMAL RESISTANCE |
|---|---|---|---|
| COMPARATIVE SAMPLE (NO SLIT) | 0 | 1 | 1 |
| SAMPLE-1 (SLIT WIDTH OF 0.5 MM) | 1/8 | 1.1 | 1.3 |
| SAMPLE-2 (SLIT WIDTH OF 1.5 MM) | 1/2.7 | 1.3 | 2.0 |

US 8,076,771 B2

SEMICONDUCTOR DEVICE HAVING METAL CAP DIVIDED BY SLIT

CROSS-REFERENCE TO RELATED APPLICATION

This application is based upon, claims the benefit of priority of, and incorporates by reference the contents of Japanese Patent Application No. 2007-167063 filed on Jun. 26, 2007.

BACKGROUND

1. Field of the Invention

The present invention relates to a semiconductor device, and more particularly, to a semiconductor device in which a semiconductor chip is bonded to a metal cap.

2. Description of Related Art

Figure 1:
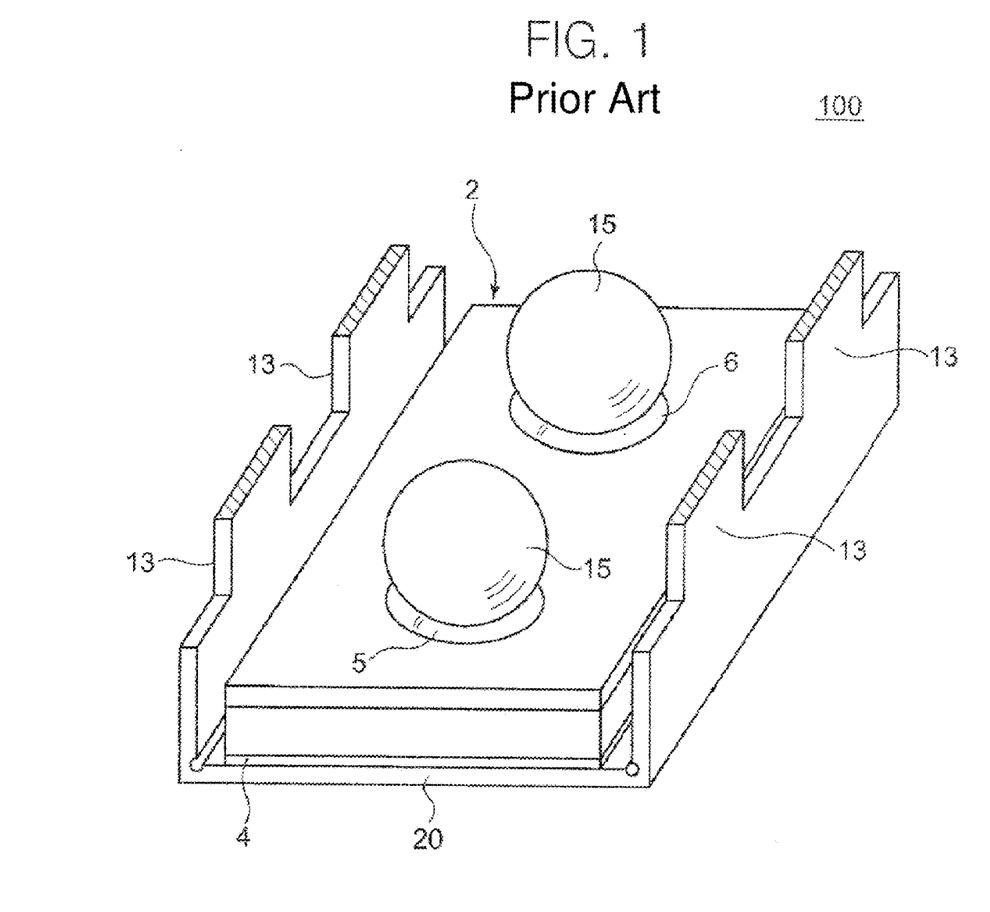
FIG. 1 is a perspective view showing a conventional semiconductor device 100.

In order to reduce a size of a semiconductor device through which a larger current flows, such as a power metal-oxide semiconductor field-effect transistor (MOSFET), there is developed a chip size package (CSP) in which a semiconductor chip is mounted to a metal cap having integrally-formed external connection terminals. FIG. 1 shows a semiconductor device 100 shown in FIG. 8 of JP 2004-040008 A (equivalent to United States Patent Application Publication No. US 2004/0021216 A1 (hereinafter referred to as "Hosoya")). A gate electrode 5, a source electrode 6, and surface electrodes 15 each electrically connected thereto are formed on a principal surface of a semiconductor chip 2. The surface electrodes 15 are electrically connected to, for example, a printed circuit board (not shown). A drain electrode 4 is formed on a rear surface of the semiconductor chip 2 and bonded to a metal cap 20 by a bonding material (not shown). Both side portions of the metal cap 20 are bent. External connection terminals 13 for electrically connecting the drain electrode 4 to, for example, the printed circuit board (not shown) are formed in the bent side portions.

In the semiconductor device 100, the bent side portions of the metal cap 20 are partially cut away to form the external connection terminals 13. The cutaway is made such that an area of parts of the external connection terminals 13 of the metal cap 20, which are connected to the printed circuit board or the like, is substantially equal to an area of parts of the plurality of surface electrodes 15 of the semiconductor chip 2, which are connected to the printed circuit board or the like. Therefore, a heat capacity of the surface electrode 15 side becomes equal to a heat capacity of the external connection terminal 13 side, so an excellent connection structure can be obtained.

The semiconductor device 100 is extremely effective to extract a larger current from the semiconductor chip 2 and to release heat from the semiconductor chip 2. In the case of the semiconductor device 100, a solder material is used as a bonding material for bonding the semiconductor chip 2 to the metal cap 20. The metal cap 20 is made of a material containing copper (Cu) as a main ingredient and has a linear expansion coefficient which is four or five times higher than a linear expansion coefficient of the semiconductor chip 2 made of silicon (Si). Therefore, thermal stress is produced in a bonding region between the metal cap 20 and the semiconductor chip 2 because of a temperature difference repeatedly caused during a temperature cycle test or actual use. Thus, the inventor of the present invention has found that the solder material might be peeled off to increase an electrical resistance and a thermal resistance.

When members having different linear expansion coefficients are bonded to each other, in order to reduce thermal stress produced between the members, it may be necessary to lower elastic coefficients of the members or an elastic coefficient of the bonding material or to reduce a bonding area therebetween. In general, in order to absorb the thermal stress between the semiconductor chip and the metal cap, for example, a silicone resin which contains silver (Ag) fillers and has a low elastic coefficient may be used as the bonding material. However, in the case of the semiconductor device through which the larger current flows, such as the power MOSFET, it is necessary to lower the electrical resistance of the bonding material, and a volume resistivity of the Ag filler is two to ten times higher than a volume resistivity of the solder material, so the solder material is used in many cases. As a result, thermal stress is produced in an inner portion of the solder material, an interface between the solder material and the semiconductor chip, and an interface between the solder material and the metal cap, which causes peeling between the members.

Figure 2A:
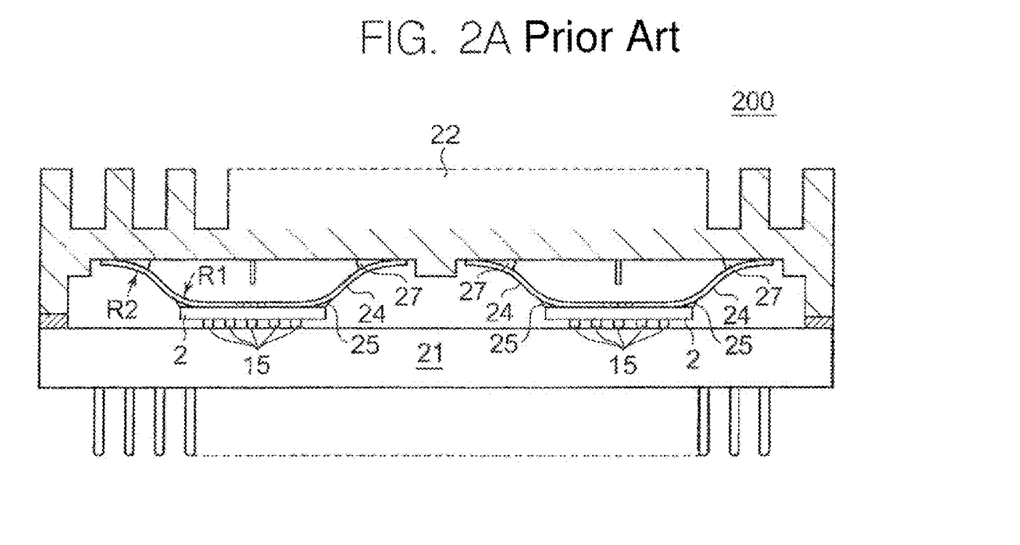
FIG. 2A is a cross-sectional view showing another conventional semiconductor device 200.

FIG. 2A shows a semiconductor device 200 shown in FIG. 1 of JP 58-033860 A (equivalent to U.S. Pat. No. 4,415,025 (hereinafter referred to as "Horvath")). In the semiconductor device 200 which is not the CSP, the semiconductor chips 2 are connected to a substrate 21 through the surface electrodes 15 formed on the principal surface thereof, and the rear surface of each of the semiconductor chips 2 is bonded to a finned cap 22 through a thermal bridge element 24 made of metal.

Figure 2B:
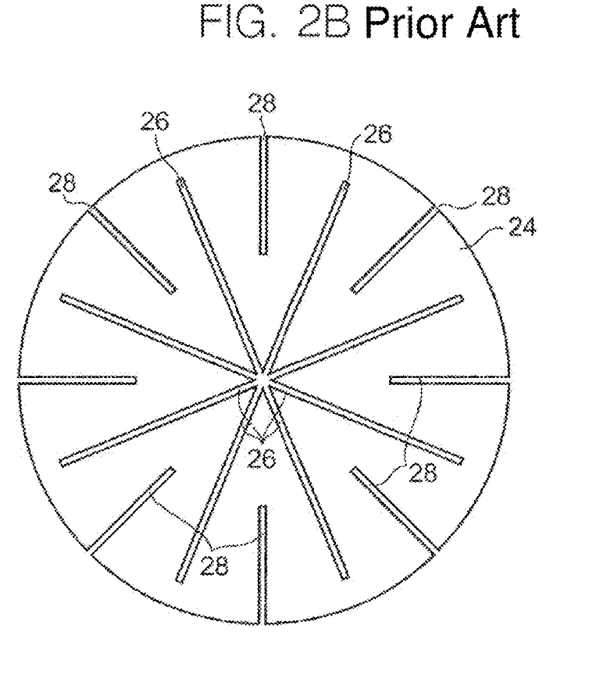
FIG. 2B is a plan view showing a thermal bridge element 24 of the semiconductor device 200.

FIG. 2B is a plan view showing the thermal bridge element 24. The thermal bridge element 24 has slits 26 radially formed from the center and slits 28 formed from the circumference toward the center. The slits 26 and 28 provide flexibility to the thermal bridge element 24, so a load on each of the semiconductor chips 2 can be adjusted.

In the case of the semiconductor device 200, in order to bond each of the semiconductor chips 2 to the finned cap 22, the thermal bridge element 24 having flexibility is interposed therebetween, so thermal stress may be reduced. However, FIG. 5 of Horvath shows that, in order to release heat generated by the semiconductor chips 2 to the finned cap 22, it is desirable to narrow a gap between each of the semiconductor chips 2 and the finned cap 22 and to increase curvature radii R1 and R2 of the thermal bridge element 24. That is, it is difficult to reduce a size of the thermal bridge element 24, so the semiconductor device 200 cannot be reduced in size so as to be equal to the CSP such as the semiconductor device 100 of Hosoya. It is necessary to bond each of the semiconductor chips 2 to the thermal bridge element 24 by a low melting point metal 25 and to bond the thermal bridge element 24 to the finned cap 22 by a low melting point metal 27, thereby increasing a manufacturing cost.

SUMMARY

Hereinafter, embodiments of the present invention will be described in conjunction with reference numerals and symbols which are used in DETAILED DESCRIPTION OF THE PREFERRED EMBODIMENTS. The reference numerals and symbols are added in parentheses to make clear a correspondence relationship between the description of claims and the description of DETAILED DESCRIPTION OF THE PREFERRED EMBODIMENTS. Note that the reference numerals and symbols should not be used for the interpretation of the technical scope of the invention described in claims.

A principal feature of a semiconductor device according to an embodiment of the present invention is that a bonding region between a semiconductor chip (2) and a flat portion (11) of a metal cap (1, 1a) is divided into a plurality of regions by a slit (7, 7a) formed in the flat portion (11). The semiconductor chip (2) has surface electrodes (15) provided on a principal surface thereof. A surface opposite to the principal surface is bonded to the flat portion (11) of the metal cap (1, 1a). The metal cap (1, 1a) includes side wall portions (12) made of the same material as a material of the flat portion (11). The flat portion (11) includes the slit (7, 7a) passing from a surface to which the semiconductor chip (2) is bonded to a surface opposite thereto. The slit (7, 7a) is formed across the semiconductor chip (2) The bonding region between the flat portion (11) and the semiconductor chip (2) is divided into the plurality of regions by the slit (7, 7a).

In the semiconductor device according to the embodiment of the present invention, the bonding region between the semiconductor chip (2) and the metal cap (1, 1a) is divided by the slit (7, 7a) to form small divisional bonding regions. Therefore, a thermal stress applied to each of the divisional bonding regions becomes smaller, so each of the divisional bonding regions is resistant to peeling The metal cap (1, 1a) itself includes the slit (7, 7a) and thus can be reduced in size and easily processed compared with using the thermal bridge element 24. Thus, it is possible to obtain a small-size semiconductor device whose bonding reliability between the semiconductor chip (2) and the metal cap (1, 1a) is improved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described with reference to the attached drawings. In each of the drawings, the same constituent elements are denoted by the same symbols and thus their description will be omitted as appropriate. In each of the drawings, the structures of portions which are not directly related to the essence of the present invention will be omitted.

Embodiment 1

Figure 3:
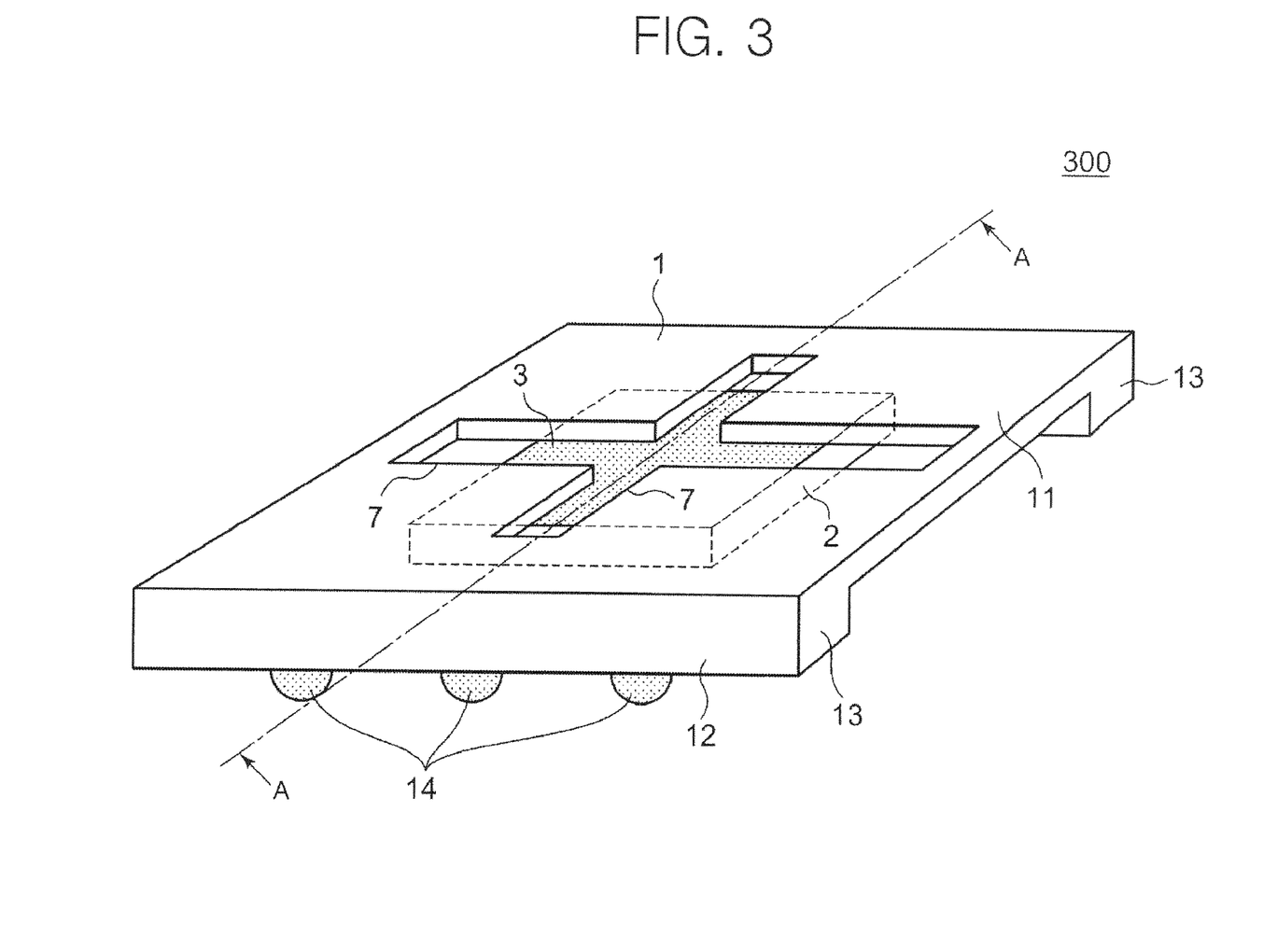
FIG. 3 is a perspective view showing a semiconductor device 300 according to Embodiment 1 of the present invention.
Figure 4:
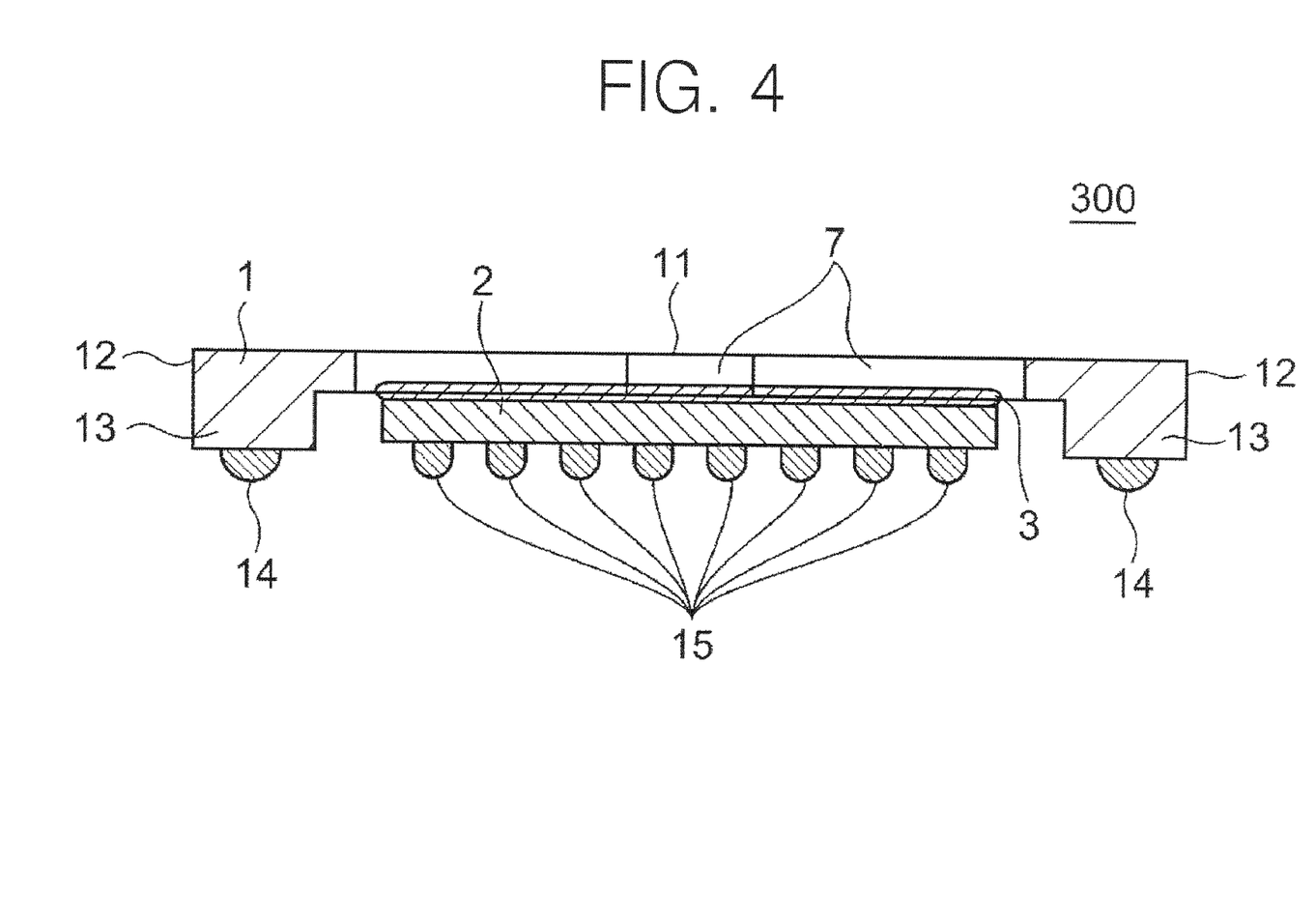
FIG. 4 is a cross-sectional view taken along the A-A line of FIG. 3.
Figure 5:
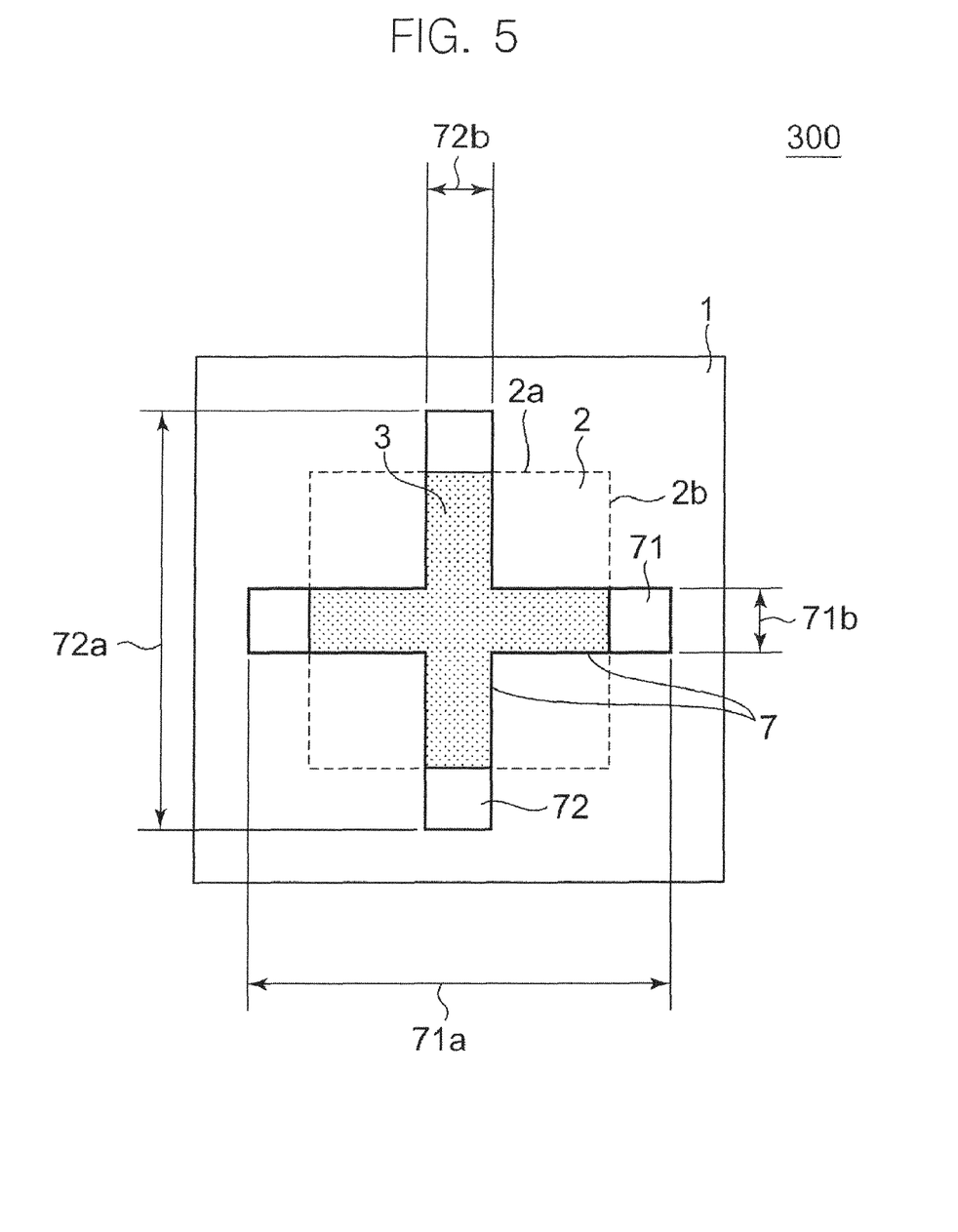
FIG. 5 is a top view showing the semiconductor device 300 according to Embodiment 1 of the present invention.

FIG. 3 is a perspective view showing a semiconductor device 300 according to Embodiment 1 of the present invention. FIG. 4 is a cross-sectional view taken along the A-A line of FIG. 3. FIG. 5 is a top view showing the semiconductor device 300. A plurality of surface electrodes 15 are formed on a principal surface of a semiconductor chip 2, so a gate electrode and a source electrode (each of which is not shown) can be connected to, for example, a printed circuit board (not shown) using a flip-chip technology. A drain electrode (not shown) is formed on a rear surface of the semiconductor chip 2 and bonded to a flat portion 11 of a metal cap 1 by a bonding material 3. Side wall portions 12 of the metal cap 1 extend to the semiconductor chip 2 side so as to serve as external connection terminals 13 and can be connected to, for example, the printed circuit board through solder balls 14 formed at tip ends. The bonding material 3 is made of a material whose thermal conductivity and electrical conductivity are high, for example, a solder material. The metal cap 1 is desirably made of, for example, a Cu alloy which has a high thermal conductivity and a high electrical conductivity, is easy to be soldered, and can be manufactured at low cost.

As shown in FIG. 5, slits 71 and 72 parallel to sides 2a and 2b of the semiconductor chip 2 are formed in the flat portion 11 of the metal cap 1 within a region in which the semiconductor chip 2 is bonded. The slits 71 and 72 are formed across the semiconductor chip 2 and a length thereof is set to a value equal to or larger than a value of a length of the sides 2a and 2b of the semiconductor chip 2. The slits 71 and 72 are combined together and serve as a cross-shaped slit 7. FIGS. 3 to 5 show the example in which the slits 71 and 72 are formed so as to extend to the outside of the semiconductor chip 2. The bonding region between the semiconductor chip 2 and the metal cap 1 is divided into four rectangular bonding regions by the slit 7.

When the semiconductor device connected to, for example, the printed circuit board is exposed to a change in temperature, the metal cap 1, the bonding material 3, the semiconductor chip 2, and the printed circuit board tend to expand and contract according to the respective linear expansion coefficients. However, the expansion and contraction of the metal cap 1, the bonding material 3, and the semiconductor chip 2 bonded to one another are limited to some extent. As a result, a thermal stress is produced. An intensity of the thermal stress becomes larger as a maximum distance of the bonding region increases.

In the semiconductor device 300, the metal cap 1 is slit to divide the bonding region, thereby reducing the thermal stress. When the slit 71 parallel to the side 2a of the semiconductor chip 2 is formed along a center line of the bonding region, the bonding region is divided into two regions, each of which has half the area of the semiconductor chip 2. When the slit 72 parallel to the side 2b of the semiconductor chip 2 is further formed along another center line of the bonding region, the bonding region is divided into four regions, each of which has one-quarter of the area of the semiconductor chip 2. The thermal stress becomes smaller along with a reduction in maximum distance of the bonding region.

Figure 6A:
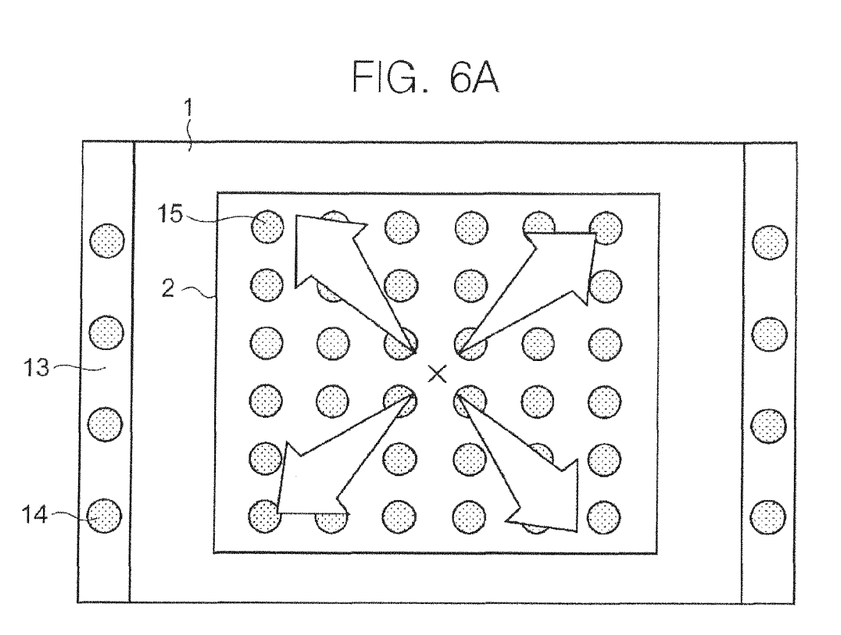
FIG. 6A is an explanatory view of a thermal stress produced in a semiconductor device having no slit.
Figure 6B:
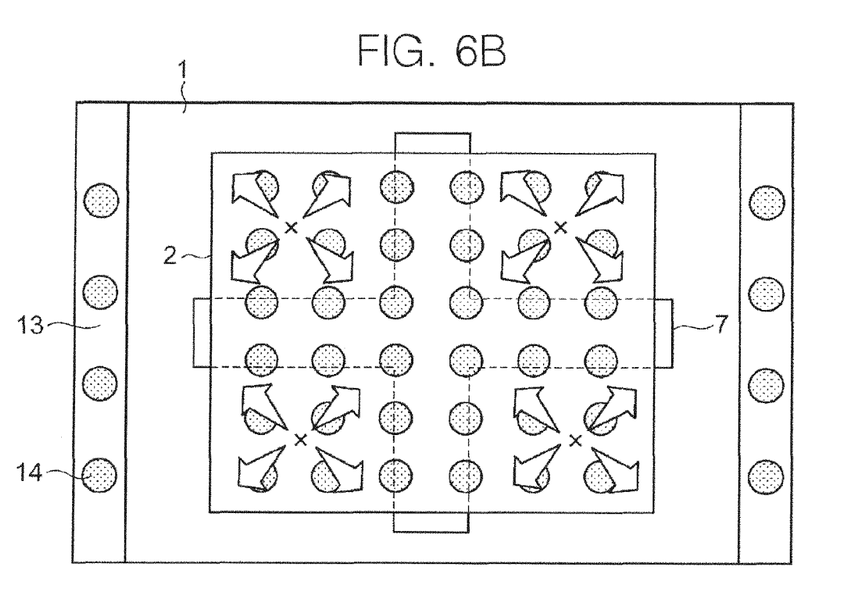
FIG. 6B is an explanatory view of a thermal stress produced in the semiconductor device 300 according to Embodiment 1 of the present invention.

FIG. 6A is an explanatory view of a thermal stress produced in a semiconductor device having no slit. FIG. 6B is an explanatory view of a thermal stress produced in the semiconductor device 300. Each of FIGS. 6A and 6B is a plan view in the case where the semiconductor device is viewed from the surface side connected to, for example, the printed circuit board. The intensity of the stress is proportional to a distance from the center point of the stress, so the stress becomes larger as the distance from the center point of the stress increases. When no slit is provided, the center point of the stress is denoted by "X" of FIG. 6A and maximum stresses are produced at corners (vertices) of the semiconductor chip 2 as indicated by white arrows. A size of the white arrow indicates an intensity of the maximum stress. In contrast to this, when the slit 7 is formed to divide the bonding region between the semiconductor chip 2 and the metal cap 1 into four regions, as shown in FIG. 6B, a distance between the center point of the stress (which is marked by "X") and each of the corners (vertices) in each of the four bonding regions becomes shorter. Therefore, as is apparent from the sizes of the white arrows, the intensities of the maximum stresses become significantly smaller compared with the case where no slit is provided.

In other words, the slit 7 is desirably formed to reduce a maximum distance of each of the four bonding regions between the semiconductor chip 2 and the metal cap 1. In the case of FIG. 6A, a diagonal distance of the semiconductor chip 2 corresponds to the maximum distance. In the case of FIG. 6B, a diagonal distance of each of the four bonding regions corresponds to the maximum distance. The thermal stress applied to each of the four bonding regions shown in FIG. 6B becomes equal to or smaller than half the thermal stress produced in the case of FIG. 6A, so each of the four bonding regions is resistant to peeling. Thus, bonding reliability between the semiconductor chip 2 and the metal cap 1 can be significantly improved.

An area of the bonding region between the semiconductor chip 2 and the metal cap 1 is reduced by an area of the slit 7. However, the bonding material 3 which is conductive is formed on side surfaces of the slit 7 and in an inner portion thereof. Therefore, an electrical resistance between the semiconductor chip 2 and the metal cap 1 does not increase proportionally to a reduced bonding area.

When a length of the slit 71 (72) is set to a value larger than a sum of the length of the side 2a (2b) of the semiconductor chip 2 and an alignment margin for bonding the semiconductor chip 2 to the metal cap 1, the bonding region between the semiconductor chip 2 and the metal cap 1 can be divided with reliability. Even when partial peeling occurs between members, the peeling does not extend beyond the slits, so a maximum peeling area is equal to or smaller than its divisional bonding area at most.

A length of the slit 7 is desirably set to at least a value equal to or larger than the value of the side length of the semiconductor chip 2. When the length of the slit 7 does not include an alignment margin between the semiconductor chip 2 and the metal cap 1, a bonding region between the semiconductor chip 2 and the metal cap 1 may be left without being divided. However, an area of the left bonding region is much smaller than an area of the entire bonding region. Even if peeling occurs between members in the left bonding region, overall bonding reliability between the semiconductor chip 2 and the metal cap 1 is improved more significantly compared with conventional cases.

Figure 11:
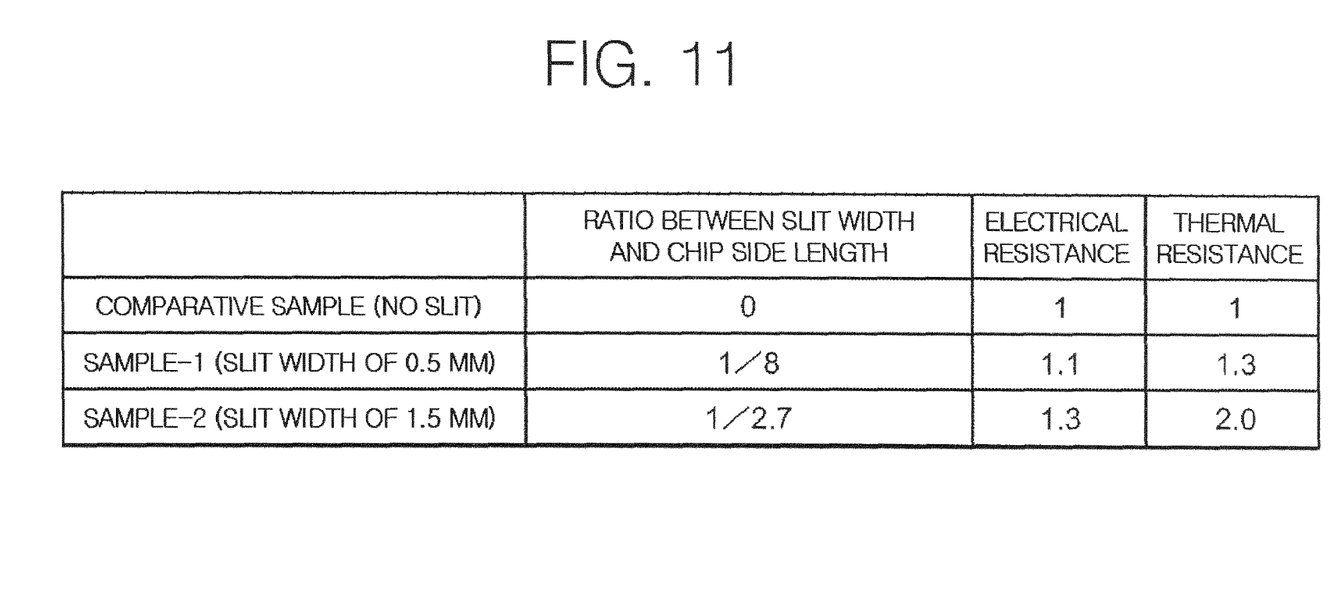
FIG. 11 is a table showing electrical resistance ratios and thermal resistance ratios (approximate values) between Comparative Sample and Sample-1 and Sample-2 of the semiconductor device 300 according to Embodiment 1 of the present invention.

The slit 7 is designed such that a width thereof becomes approximately $\frac{1}{3}$ or less of the side length of the semiconductor chip 2. In other words, the slit 71 is designed such that a width 71b thereof becomes approximately $\frac{1}{3}$ or less of the length of the side 2b. The slit 72 is designed such that a width 72b thereof becomes approximately $\frac{1}{3}$ or less of the length of the side 2a. The reason will be described below. When the slits 71 and 72 are formed, the area of the bonding region between the semiconductor chip 2 and the metal cap 1 becomes smaller, so the electrical resistance and the thermal resistance increase. Therefore, it is necessary to limit the widths of the slits. FIG. 11 shows electrical resistance ratios and thermal resistance ratios (approximate values) between Comparative Sample and Sample-1 and Sample-2 of the semiconductor device 300 in the case where a size of each of the sides 2a and 2b of the semiconductor chip 2 is set to 4.0 mm and a thickness of the metal cap 1 is set to 1.0 mm. Comparative Sample has no slit. Sample-1 has a slit width of 0.5 mm. Sample-2 has a slit width of 1.5 mm. Note that a thermal resistance in the case where heat is transferred through the surface of the metal cap 1 is not taken into account. As is apparent from FIG. 11, the thermal resistance particularly increases with an increase in slit width. In order to suppress the increase in thermal resistance to approximately two or less times a thermal resistance in the case where no slit is provided, it is preferable to suppress the slit width to $\frac{1}{3}$ or less of the side length of the semiconductor chip 2.

In addition, the width of the slit 7 is desirably equal to or larger than at least $\frac{1}{10}$ of a thickness of the flat portion 11 of the metal cap 1. As a method of forming a passing through slit in a metal plate, there is die punching, cutting, laser processing, or the like. In the case of die punching, when a passing through slit width becomes narrower than, for example, a plate thickness, processing is difficult. In the cases of the other methods, when the passing through slit width becomes $\frac{1}{10}$ or less of the plate thickness, processing is difficult. Therefore, a manufacturing cost rapidly increases. The slit 7 of the metal cap 1 desirably has a width with which the sides of the slit 7 are not bonded together by expansion and contraction which may occur when the semiconductor device 300 is exposed to a change in temperature. However, it is unnecessary to perform high-precision processing, so the slit 7 desirably has a width for easy processing. For example, the formation of the slit 7 and the cutout of the metal cap 1 are simultaneously performed, the both ends of the metal plate in which the slit 7 is formed are bent to form the side wall portions 12, and/or the central portion of the metal plate is thinned to form the flat portion 11. Therefore, the metal cap 1 in which the slit 7 is formed can be easily manufactured.

Figure 7:
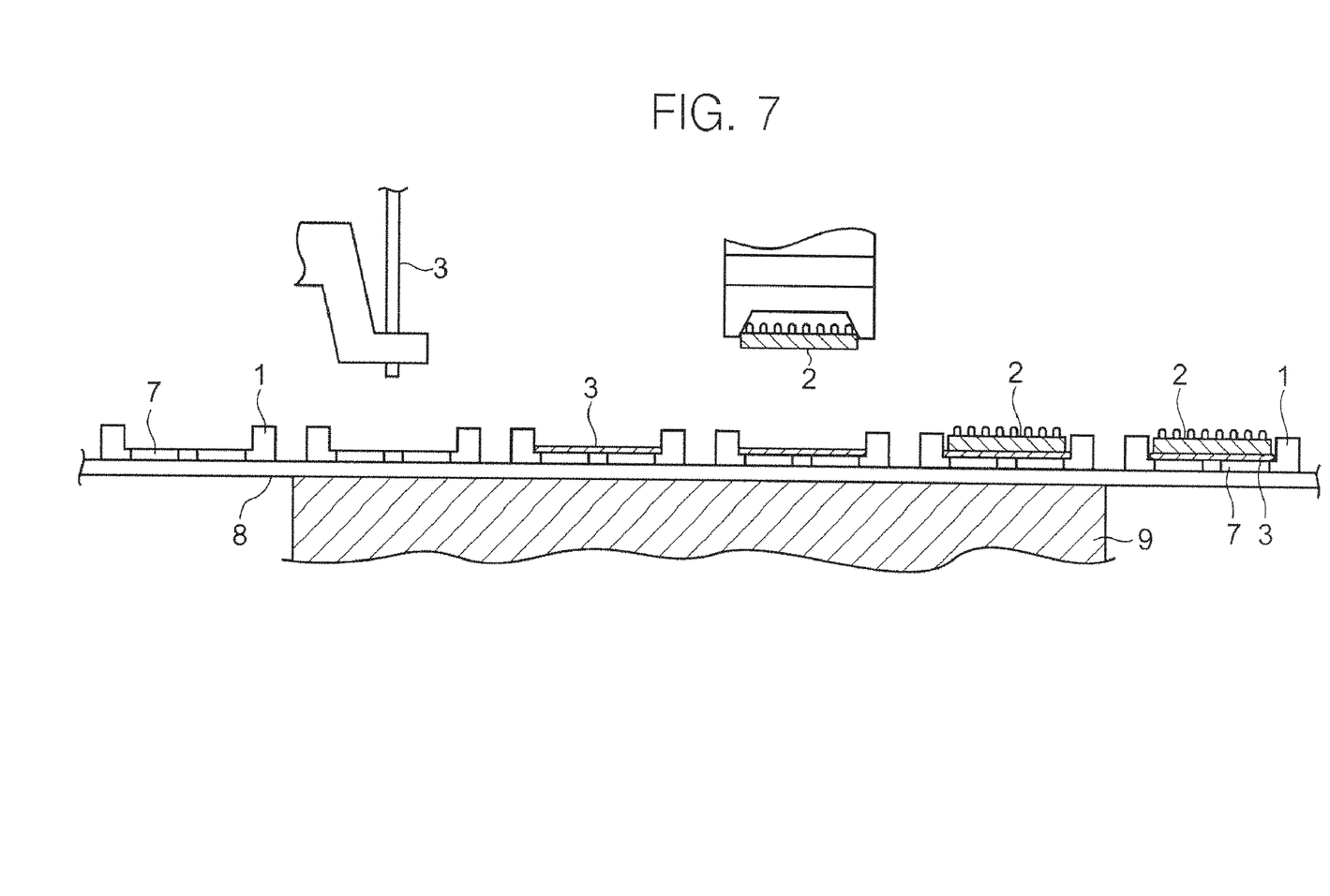
FIG. 7 is a side view showing a method of manufacturing the semiconductor device 300 according to Embodiment 1 of the present invention.

Next, a process for manufacturing the semiconductor device 300 will be described with reference to FIG. 7. A plurality of metal caps 1 each having the slit 7 are adhered to, for example, a heat-resistant tape 8 in the same orientation at regular intervals. An attached surface of the metal cap 1 to the heat-resistant tape 8 is a surface opposite to the principal surface to which the semiconductor chip 2 is bonded. The principal surface of the metal cap 1 is plated in advance so as to bond the semiconductor chip 2 thereto by, for example, soldering. The metal cap 1 is transferred above a heater 9. The bonding material 3 such as a wire-shaped, tape-shaped or paste-type solder material is supplied to a region to which the semiconductor chip 2 is bonded. Then, the semiconductor chip 2 on which the surface electrodes 15 are formed is placed on the metal cap 1 to bond the semiconductor chip 2 to the metal cap 1 by the bonding material 3. Note that the bonding material 3 may be formed not on the metal cap 1 but on the rear surface of the semiconductor chip 2 in advance.

After that, the metal cap 1 to which the semiconductor chip 2 is bonded is removed from the heat-resistant tape 8. The heat-resistant tape 8 is useful to prevent the bonding material 3 from sticking out from the slit 7 formed in the metal cap 1, thereby preventing the bonding material 3 from depositing on a transfer lane of a mounter or a jig (tool).

As described above, according to the semiconductor device 300, the slit 7 obtained by combining the slits 71 and 72 parallel to the sides 2a and 2b of the semiconductor chip 2, respectively, is formed to divide the bonding region between the semiconductor chip 2 and the metal cap 1 into the plurality of divisional bonding regions, each of which is rectangular. Therefore, the maximum distance of each of the divisional bonding regions can be shortened, that is, the distance between the center point of the stress and the position in which the maximum stress is produced can be shortened, to reduce the thermal stress. The thermal stress applied to each of the divisional bonding regions in the semiconductor device 300 becomes equal to or smaller than half the conventional thermal stress, so each of the divisional bonding regions is resistant to peeling and thus the bonding reliability is significantly improved. Even when peeling occurs in any divisional bonding region, peeling is confined to the divisional bonding region, with the result that peeling hardly occurs in another divisional bonding region. The bonding area between the semiconductor chip 2 and the metal cap 1 is reduced by the area of the slit 7. However, the bonding material 3 which is conductive is formed on the side surfaces of the slit 7 and in the inner portion thereof. Therefore, the electrical resistance between the semiconductor chip 2 and the metal cap 1 does not increase proportionally to the reduced bonding area.

Embodiment 2

Figure 8:
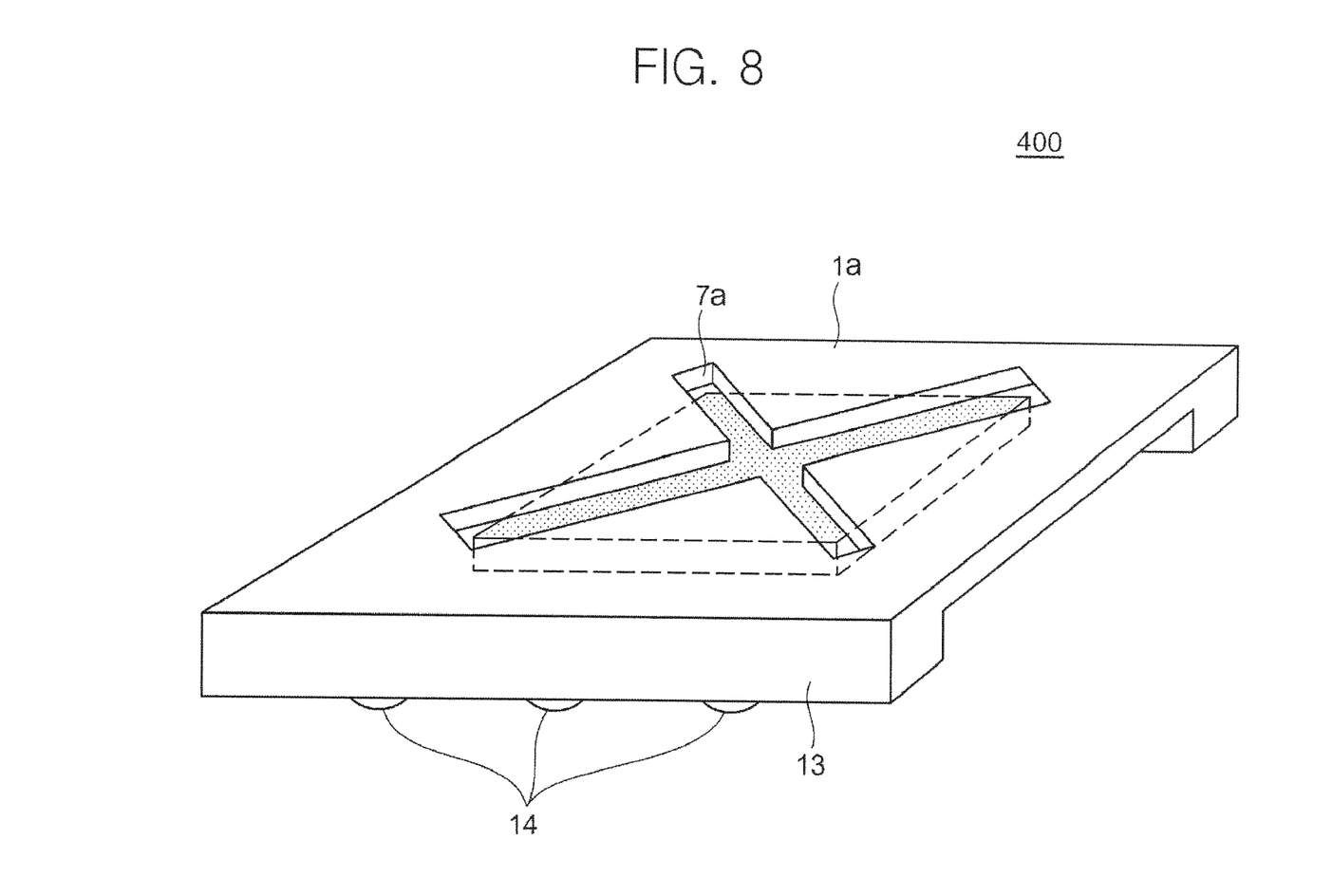
FIG. 8 is a perspective view showing a semiconductor device 400 according to Embodiment 2 of the present invention.
Figure 9:
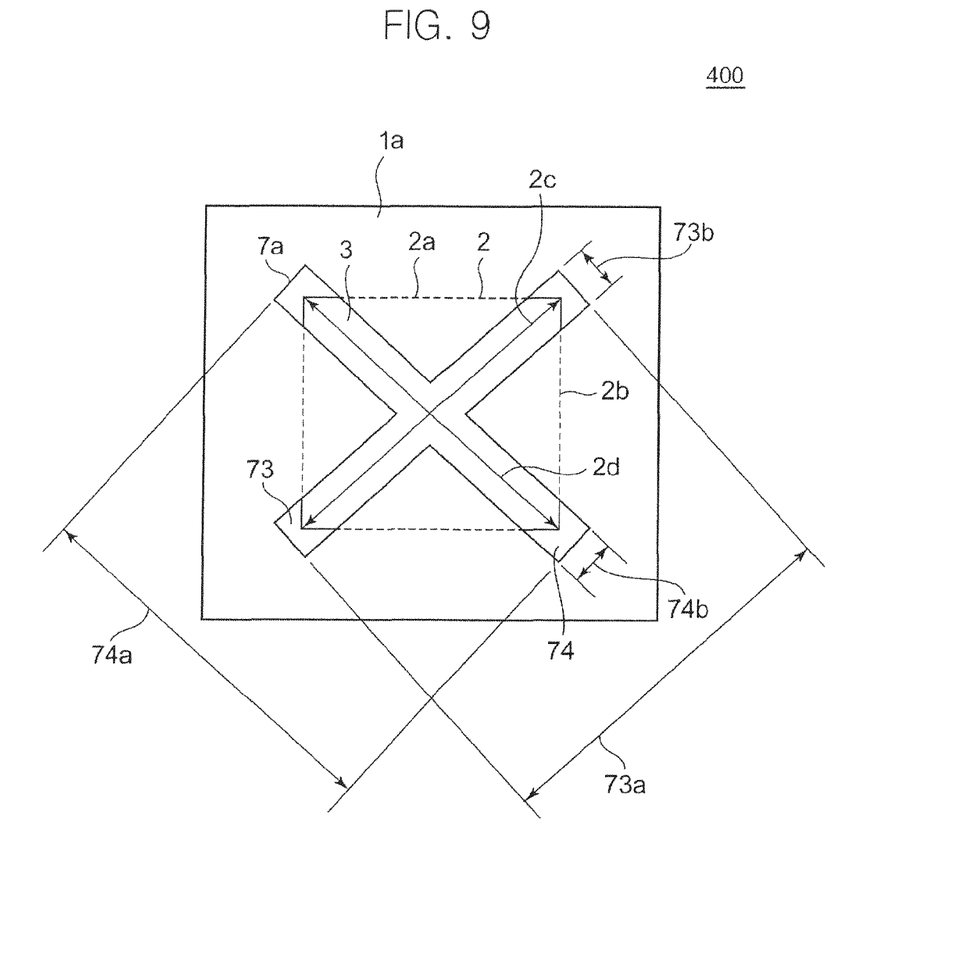
FIG. 9 is a top view showing the semiconductor device 400 according to Embodiment 2 of the present invention.

FIG. 8 is a perspective view showing a semiconductor device 400 according to Embodiment 2 of the present invention. FIG. 9 is a top view showing the semiconductor device 400. In the semiconductor device 400, slits 73 and 74 are formed on diagonal lines 2c and 2d of the semiconductor chip 2. In other words, the slit 7a obtained by combining the slits 73 and 74 is provided to expose the corners (vertices) of the semiconductor chip 2. Each divisional bonding region between the semiconductor chip 2 and the metal cap 1a has a triangular shape.

Figure 10:
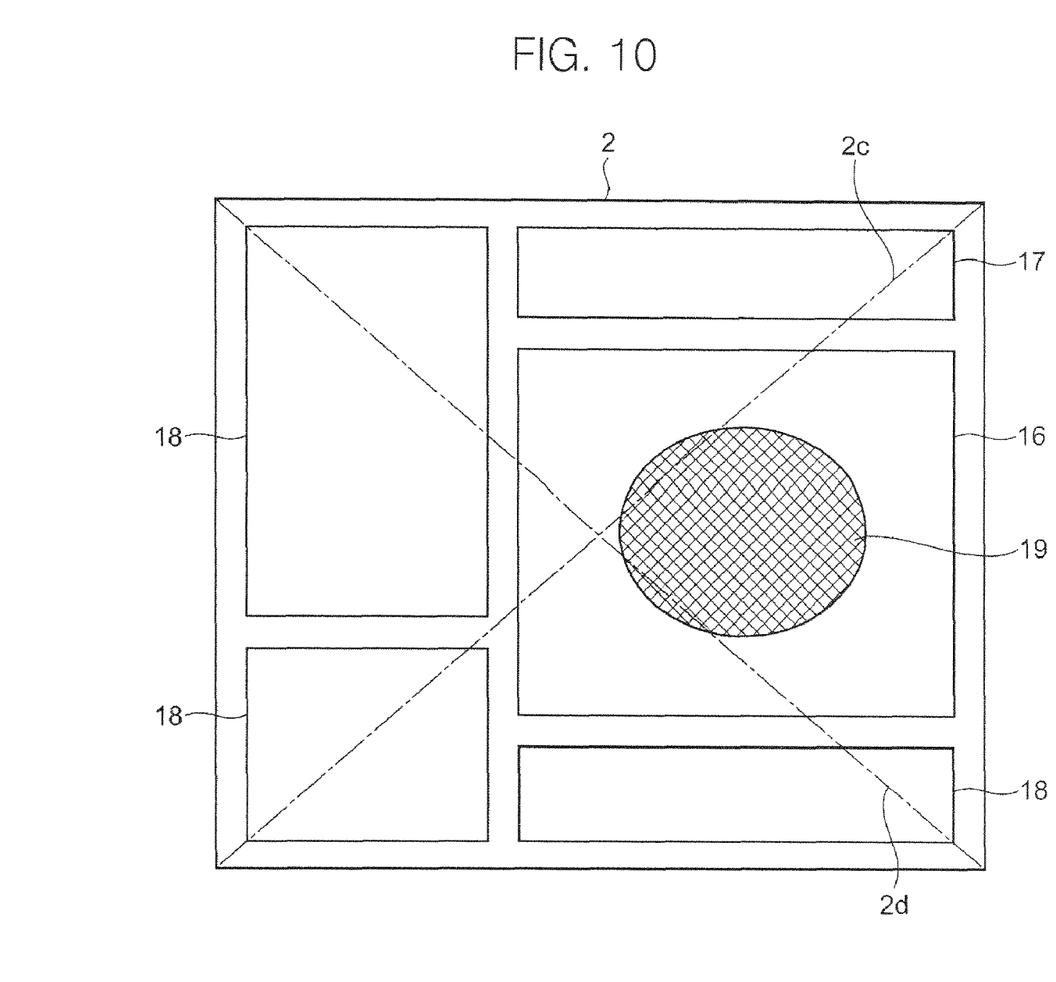
FIG. 10 is a layout showing an example of a semiconductor chip 2.

Incidentally, a high-heat region may be partially produced depending on a layout of the semiconductor chip 2. In order to improve a thermal radiation effect, the slit is desirably formed to avoid the high-heat region. FIG. 10 is a layout showing an example of the semiconductor chip 2. The semiconductor chip 2 includes, for example, a power MOSFET section 16 with a power supply switch function, a control circuit section 17 for controlling the power MOSFET section 16, and an application circuit section 18 having various functional blocks. The power MOSFET section 16 generates a large amount of heat. Each of the control circuit section 17 and the application circuit section 18 generates a relatively small amount of heat. Therefore, a high-heat region 19 is produced in an unbalanced position of the semiconductor chip 2. When the cross-shaped slit 7 as shown in FIG. 5 is formed, the slit 71 crosses the center of the high-heat region 19. However, when the slit 7a is formed on the diagonal lines 2c and 2d (dashed lines shown in FIG. 10) of the semiconductor chip 2 as shown in FIG. 9, the high-heat region 19 can be substantially avoided. When the high-heat region 19 is produced in a more unbalanced position, the slit 7a may be formed in an asymmetrical shape depending on the location of the high-heat region 19. However, when the slit 7a is formed to equally divide the bonding region of the semiconductor chip 2, it is unlikely to cause peeling because each bonding region between the semiconductor chip 2 and the metal cap 1a is arranged in a balanced manner.

It is apparent that the present invention is not limited to the above embodiments, but may be modified and changed without departing from the scope and spirit of the invention.

As described above, the slit 7 of the semiconductor device 300 is the cross-shaped slit obtained by combining the slits 71 and 72, and the slit 7a of the semiconductor device 400 is the cross-shaped slit obtained by combining the slits 73 and 74. However, the slit is not limited to the cross-shaped slit, and thus various modifications can be made. For example, a single-stripe slit or a slit having a plurality of slits may be arranged in a stripe shape, or a slit having three or more slits may be radially arranged. In the case where the bonding region between the semiconductor chip 2 and the metal cap is divided, even when a bonding defect such as peeling occurs in a divisional bonding region, the bonding defect is confined to the divisional bonding region, with the result that the bonding reliability is improved. The number of divisional bonding regions can be increased as long as the electrical resistance and the thermal resistance are within allowable ranges.

The external connection terminals 13 of the metal cap may be formed not only on the opposed two sides but also on three sides or four sides.

What is claimed is:

1. A semiconductor device, comprising:
   a semiconductor chip including a principal surface and a back surface opposite to the principal surface, the principal surface having a surface electrode; and
   a metal cap including a flat portion and sidewall portions, the flat portion being bonded with the back surface of the semiconductor chip, the side wall portions being formed on at least two opposed sides of the flat portion and made of the same material as a material of the flat portion,
   wherein the flat portion includes a slit passing entirely through a thickness of the flat portion from a surface to which the semiconductor chip is bonded by a bonding material to a surface opposite thereto, the slit is formed across the semiconductor chip in a plan view and divides a bonding region between the flat portion and the semiconductor chip into a plurality of bonding regions, each of the plurality of bonding regions is a region where the flat portion is faced with the back surface of the semiconductor chip via the bonding material, and the plurality of bonding regions are separated individually to each other by the slit, and
   wherein the slit has a width which is equal to or larger than 1/10 of a thickness of the flat portion and equal to or smaller than 1/3 of a side length of the semiconductor chip.

2. A semiconductor device according to claim 1, wherein the slit has a cross shape.

3. A semiconductor device according to claim 2, wherein each of the plurality of bonding regions has a rectangular shape.

4. A semiconductor device according to claim 2, wherein each of the plurality of bonding regions has a triangular shape.

5. A semiconductor device according to claim 1, wherein the bonding material is further bonded to an inner portion of the slit.

6. A semiconductor device according to claim 1, wherein the bonding material is a solder material.

* * * * *